(12) United States Patent
Yoshida et al.

(10) Patent No.: US 10,549,427 B1
(45) Date of Patent: Feb. 4, 2020

(54) SUBSTRATE TRANSFER ROBOT

(71) Applicants: KAWASAKI JUKOGYO KABUSHIKI KAISHA, Kobe-shi, Hyogo (JP); KAWASAKI ROBOTICS (USA), INC., Wixom, MI (US)

(72) Inventors: Tetsuya Yoshida, Kakogawa (JP); Ming Zeng, San Jose, CA (US); Hajime Nakahara, San Jose, CA (US)

(73) Assignees: KAWASAKI JUKOGYO KABUSHIKI KAISHA, Kobe (JP); KAWASAKI ROBOTICS (USA), INC., Wixom, MI (US)

( * ) Notice: Subject to any disclaimer, the term of this patent is extended or adjusted under 35 U.S.C. 154(b) by 0 days.

(21) Appl. No.: 16/119,485

(22) Filed: Aug. 31, 2018

(51) Int. Cl.
*G05B 15/00* (2006.01)
*B25J 9/16* (2006.01)
*B65G 47/90* (2006.01)

(52) U.S. Cl.
CPC .......... *B25J 9/1697* (2013.01); *B65G 47/905* (2013.01)

(58) Field of Classification Search
CPC combination set(s) only.
See application file for complete search history.

(56) References Cited

U.S. PATENT DOCUMENTS

| 2002/0130785 A1 | 9/2002 | Weiss |
| 2012/0281875 A1 | 11/2012 | Yasuda et al. |

FOREIGN PATENT DOCUMENTS

| JP | H05-343495 A | 12/1993 |
| JP | H06-77232 U | 10/1994 |
| JP | H11-131231 A | 5/1999 |
| JP | H11-175150 A | 7/1999 |
| JP | 2000-195924 A | 7/2000 |
| JP | 2004-527116 A | 9/2004 |
| JP | 2011-211048 A | 10/2011 |
| JP | WO2011/062138 A1 | 4/2013 |

*Primary Examiner* — Bhavesh V Amin
(74) *Attorney, Agent, or Firm* — Oliff PLC

(57) ABSTRACT

A substrate transfer robot delivers/receives a substrate to/from the carrier for the substrate, coupled to an opening of the load port on a first side of the load port, from a second side opposite to the first side via the load port through the opening, and the substrate transfer robot includes a hand holding the substrate, a robot arm coupled to the hand and displacing the hand, an imaging device attached to the hand or the robot arm, and a controller configured to control operation of the robot arm and the imaging device. Controller acquires a captured image including a peripheral edge of the opening and carrier coupled to the opening and performs image processing on captured image to detect deviation of the coupling position of the carrier from a predetermined reference coupling position, the peripheral edge and the carrier being captured from the second side by the imaging device.

8 Claims, 4 Drawing Sheets

SUBSTRATE TRANSFER ROBOT

BACKGROUND OF THE INVENTION

(1) Field of the Invention

The present invention relates to a substrate transfer robot which delivers/receives a substrate to/from a carrier for the substrate, the carrier being coupled to a load port.

(2) Description of Related Art

Conventionally, there has been known a load port which for example clamps a carrier for a substrate, docks and undocks the carrier, and opens and closes a door of the carrier. Such a load port is provided, for example, in an EFEM (Equipment Front End Module) which is an interface between a carrier and a substrate processing apparatus.

JP 2000-195924 A discloses an automatic transfer system which automatically transfers a cassette (carrier) to a cassette stage of a facility. This automatic transfer system includes an automatic transfer vehicle including a camera and a hand, image recognition part which captures an image of a stage with the camera to process the image and thus to detect the presence or absence of a cassette on the stage, and a control part which causes the hand to transfer the cassette to the stage if there are no cassette and other obstacles.
[Patent Literature 1] JP 2000-195924 A When the carrier is automatically transferred to the stage of a load port as described in JP 2000-195924 A, a difference may occur between a predetermined placement reference position on the stage and an actual carrier placement position. When the carrier is docked with a load port opening in such a state, a difference may occur between a predetermined reference coupling position and an actual coupling position of a carrier. A substrate transfer robot delivers/receives a substrate to/from the carrier. In order for the substrate transfer robot to accurately delivers/receives the substrate to/from the carrier, it is necessary to recognize displacement of the coupling position of the carrier.

SUMMARY OF THE INVENTION

The present invention has been made in view of the above circumstances, and an object thereof is to provide a technique for detecting displacement of a coupling position of a carrier coupled to a load port with a substrate transfer robot.

A substrate transfer robot according to one embodiment of the present invention is a substrate transfer robot configured to deliver/receive a substrate to/from a carrier for the substrate, coupled to an opening of a load port on a first side of the load port, from a second side opposite to the first side via the load port through the opening, the substrate transfer robot including a hand holding the substrate, a robot arm coupled to the hand and displacing the hand, an imaging device attached to the hand or the robot arm, and a controller configured to control operation of the robot arm and the imaging device.

In this substrate transfer robot, the controller acquires a captured image including a peripheral edge of the opening and the carrier coupled to the opening and performs image processing on the captured image to detect a deviation of a coupling position of the carrier from a predetermined reference coupling position, the peripheral edge and the carrier being captured from the second side by the imaging device.

According to the substrate transfer robot, displacement of the coupling position of the carrier with respect to the load port can be detected based on an image captured by the imaging device mounted on the robot itself. This detection result can be reflected on operation of delivering/receiving the substrate to/from the carrier, the operation being performed by the substrate transfer robot. With one substrate transfer robot, the displacement of the coupling position of the carrier with respect to a plurality of the load ports can be similarly detected. In addition, regardless of the specifications of the load port and the carrier, the displacement of the coupling position of the carrier with respect to the load port can be similarly detected.

According to the present invention, the displacement of the coupling position of the carrier coupled to the load port can be detected by the substrate transfer robot.

DETAILED DESCRIPTION OF PREFERRED EMBODIMENT

[Schematic Configuration of Substrate Processing Equipment 100]

Figure 1:
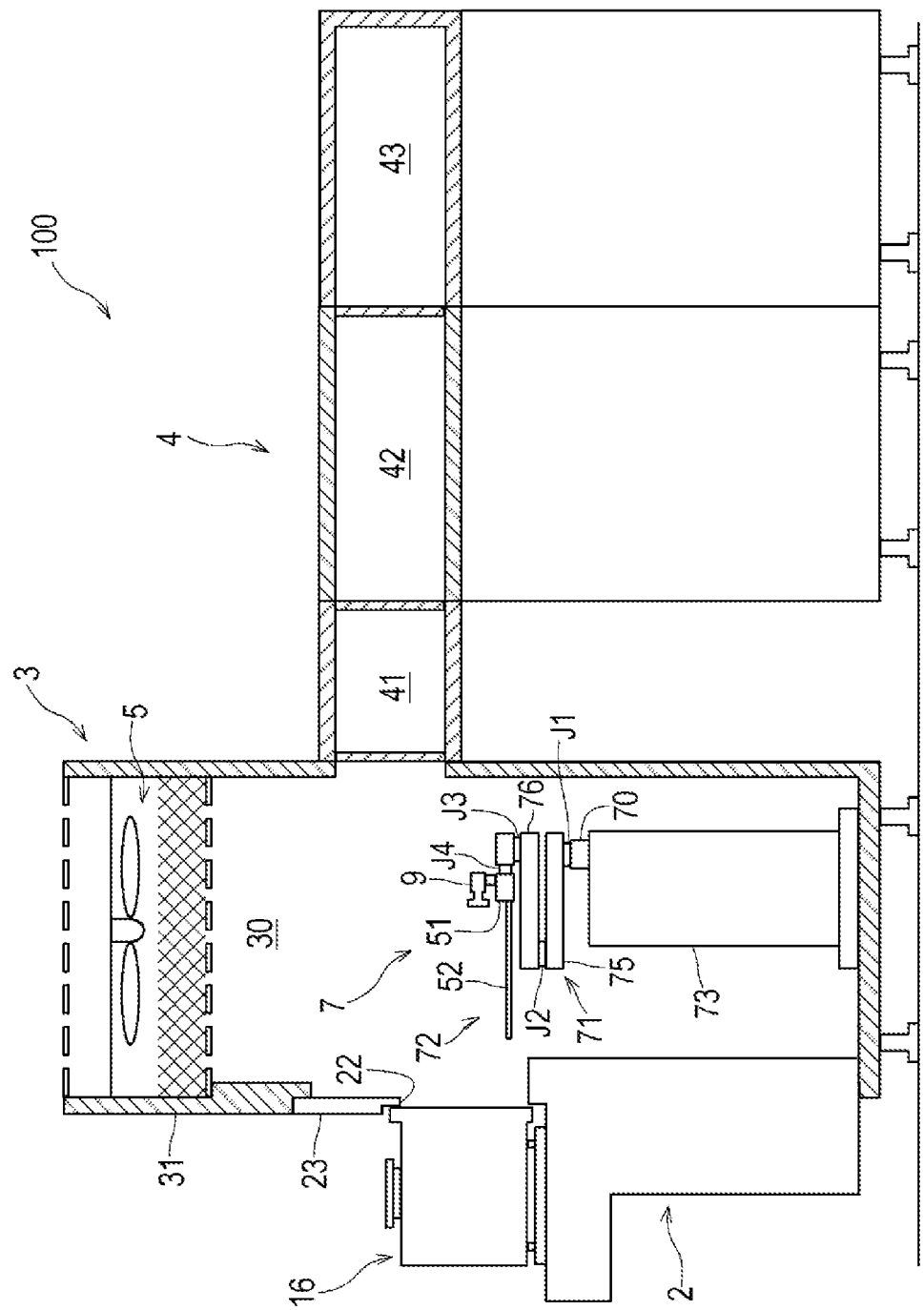
FIG. 1 is a view showing a schematic configuration of substrate processing equipment including a substrate transfer robot according to an embodiment of the present invention.
Figure 2:
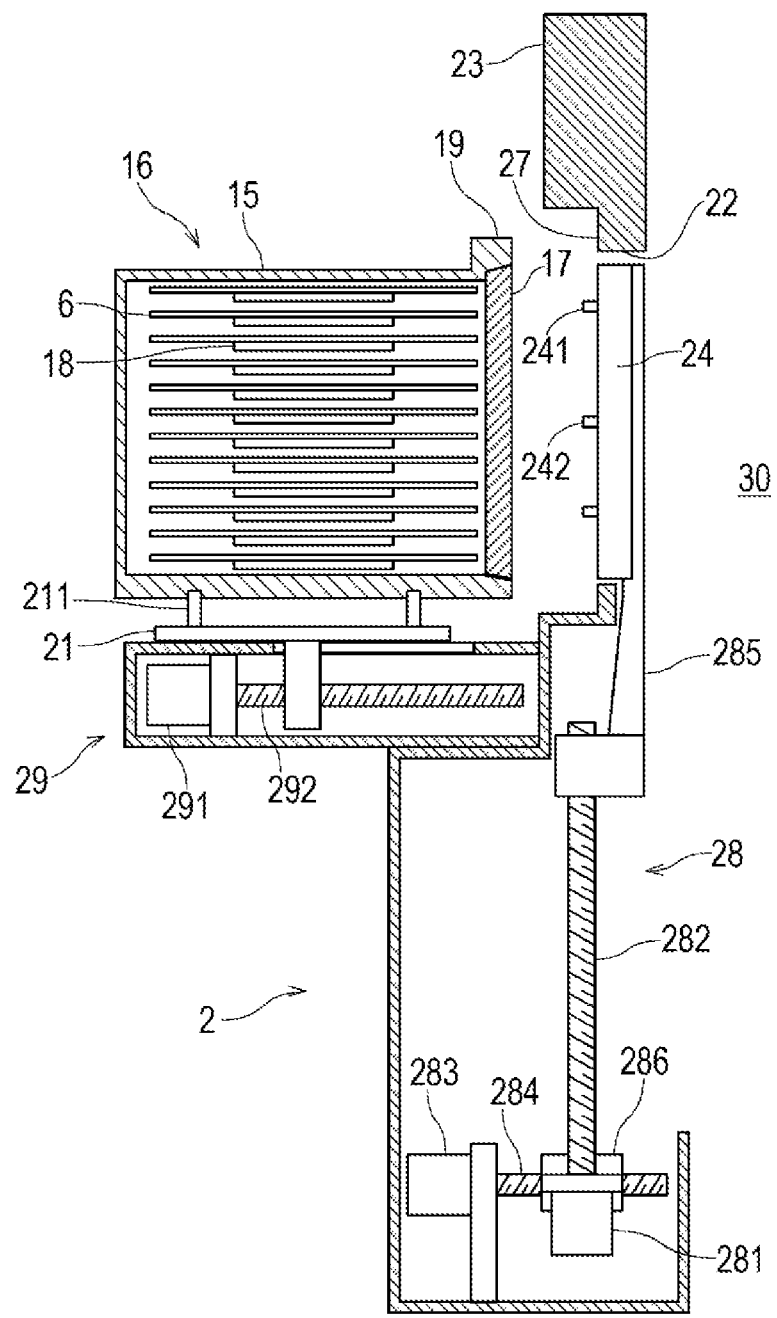
FIG. 2 is a view showing a schematic configuration of a load port shown in FIG. 1.

An embodiment of the present invention will be described in detail below with reference to the drawings. FIG. 1 is a view showing a schematic configuration of substrate processing equipment 100 including a substrate transfer robot 7 according to an embodiment of the present invention. FIG. 2 is a view showing a schematic configuration of a load port 2 shown in FIG. 1. The substrate processing equipment 100 shown in FIG. 1 includes a load port 2, a substrate transfer apparatus 3, and a substrate processing apparatus 4.

The substrate transfer apparatus 3 is an interface between a carrier 16 of a substrate and the substrate processing apparatus 4. The carrier 16 includes a container 15 formed in a box shape and including a substrate 6, and a lid 17 which seals an opening of the container 15. On an inner wall surface of the carrier 16, a plurality of shelf plates 18 for placing the substrates 6 are provided at predetermined intervals in the vertical direction.

The substrate transfer apparatus 3 has a housing 31 including a transfer chamber 30 and a fan filter unit 5 installed on the ceiling of the housing 31. Clean air supplied from the fan filter unit 5 into the transfer chamber 30 flows downward in the transfer chamber 30 and is discharged from a floor surface of the transfer chamber 30 to the outside of the apparatus. By thus supplying clean air, the interior of the transfer chamber 30 is maintained at a higher pressure than an external atmosphere and kept in a high clean atmosphere.

The housing 31 of the substrate transfer apparatus 3 includes the substrate transfer robot 7 which receives the substrate 6 from the carrier 16 to deliver the substrate 6 to the substrate processing apparatus 4 and receives the substrate 6 from the substrate processing apparatus 4 to deliver the substrate 6 to the carrier 16. The substrate transfer robot 7 will be described later in detail.

The substrate processing apparatus 4 is connected to a side surface of the housing 31 of the substrate transfer apparatus 3. The substrate processing apparatus 4 may be an apparatus subjecting the substrate to at least one or more process treatments including heat treatment, impurity introducing treatment, thin film forming treatment, lithography treatment, cleaning treatment, and flattening treatment. The substrate processing apparatus 4 has, for example, a plurality of vacuum chambers including a load lock chamber 41 which introduces the substrate 6 into a vacuum space, a process chamber 43 which processes the substrate 6, and a transfer chamber 42 which receives the substrate 6 between the load lock chamber 41 and the process chamber 43 and carries in/carries out the substrate 6. The substrate transfer apparatus 3 delivers/receives the substrate to/from the load lock chamber 41. However, the configuration of the substrate processing apparatus 4 is not limited to the above.

At least one load port 2 is provided in a side surface of the housing 31 of the substrate transfer apparatus 3 opposite to the side surface to which the substrate processing apparatus 4 is connected. The load port 2 forms a portion of the side surface of the housing 31.

As shown in FIGS. 1 and 2, the load port 2 includes a stage 21 on which the carrier 16 is placed, a plate 23 including a port opening 22 serving as a delivery/receiving port for receiving/delivering the substrate 6, a door 24 which opens and closes the port opening 22, a stage drive device 29 which moves the stage 21 forward and backward with respect to the port opening 22, and a door drive device 28 which lifts/lowers the door 24.

The stage 21 is provided with a positioning pin 211 for positioning the carrier 16 at a predetermined placement reference position. The positioning pin 211 is fitted into a positioning hole provided in a bottom portion of the carrier 16, whereby the carrier 16 is positioned on the stage 21. However, the positioning hole is an elongated hole, and the position of the carrier 16 may slightly deviate from the stage 21.

The stage 21 is moved back and forth by the stage drive device 29. The stage drive device 29 includes, for example, a motor 291 and a feed screw 292 driven by the motor 291. As the feed screw 292 rotates in forward and reverse directions, the stage 21 moves forward and backward with respect to the port opening 22. When the carrier 16 moves forward toward the port opening 22 (door 24) as the stage 21 moves forward, the lid 17 of the carrier 16 and the door 24 abut against each other. As a result, a flange 19 formed at an opening edge of the carrier 16 and a flange panel 27 provided around the port opening 22 abut against each other, and the carrier 16 and the plate 23 are coupled (docked).

The door 24 has a registration pin 241 for positioning and a latch key 242 integrated with the lid 17 by a suction force. By fitting the latch key 242 into a latch key hole (not shown) provided in the lid 17 and rotating the latch key 242 in an unlocked direction, the lid 17 is changed over to an unlocked state, and at the same time, the lid 17 and the door 24 are integrated with each other. On the other hand, by fitting the latch key 242 into the latch key hole (not shown) provided in the lid 17 and rotating the latch key 242 in a locked direction, the lid 17 is changed over to a locked state, and at the same time, integration of the lid 17 and the door 24 is released.

After the door 24 and the lid 17 are integrated with each other, the door 24 moves in a direction spaced apart from the carrier 16, whereby the lid 17 is separated from the carrier 16. The door 24 is attached to the door drive device 28 through a bracket 285. The door drive device 28 includes, for example, a lifting/lowering motor 281, a feed screw 282 driven by the lifting/lowering motor 281, a translating motor 283, and a translating feed screw 284 driven by the translating motor 283. The lifting/lowering feed screw 282 is screwed into the bracket 285, and the door 24 lifts/lowers as a result of forward/reverse rotation of the lifting/lowering feed screw 282. The translating feed screw 284 is screwed into a bracket 286 holding the lifting/lowering motor 281, and as a result of forward/reverse rotation of the translating feed screw 284, the door 24 moves forward and backward with respect to the port opening 22. In the door drive device 28, the door 24 integrated with the lid 17 moves backward from the port opening 22 and then lowers to retract the lid 17 and the door 24 from the port opening 22, so that the interior of the carrier 16 and the transfer chamber 30 are communicated with each other through the port opening 22.

[Configuration of Substrate Transfer Robot 7]

Figure 3:
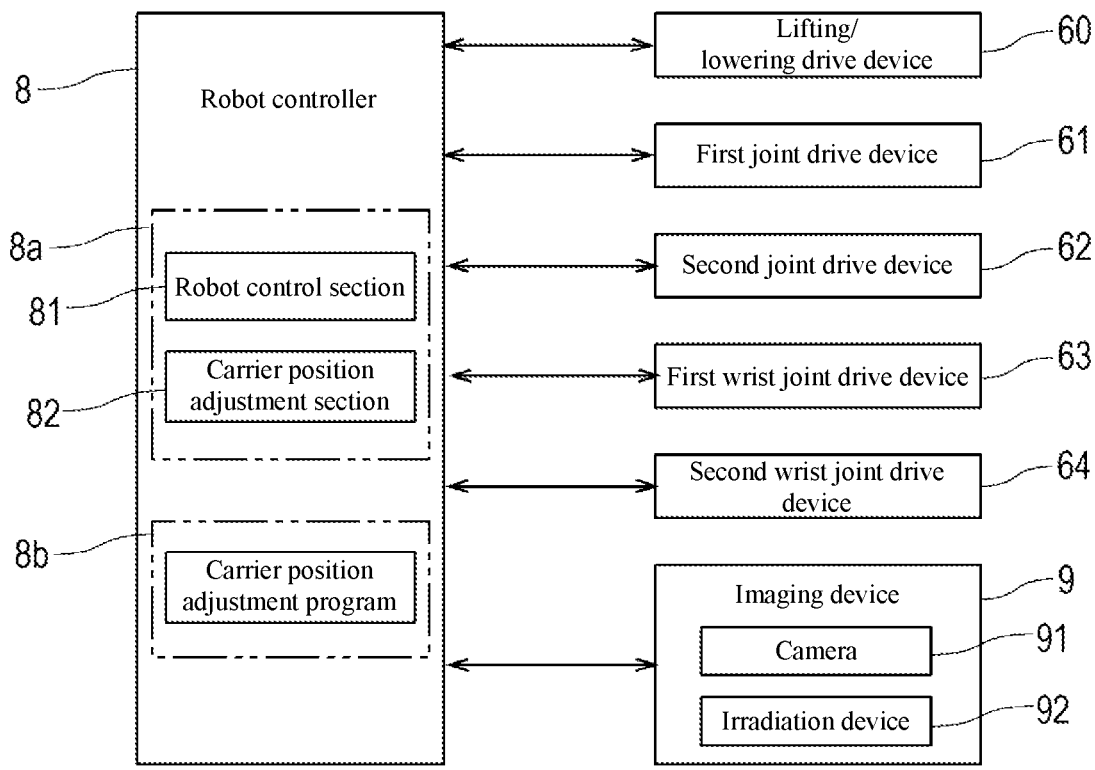
FIG. 3 is a view showing a configuration of a control system of the substrate transfer robot shown in FIG. 1.

Next, the configuration of the substrate transfer robot 7 will be described in detail. FIG. 3 is a view showing a configuration of a control system of the substrate transfer robot 7 shown in FIG. 1.

As shown in FIGS. 1 and 3, the substrate transfer robot 7 includes a robot arm (hereinafter simply referred to as "arm 71"), a substrate holding hand (hereinafter simply referred to as "hand 72") coupled to a wrist portion of the arm 71, a base 73 supporting the arm 71, an imaging device 9 mounted on the arm 71 or the hand 72, and a robot controller 8. Although the arm 71 according to the present embodiment is a horizontal articulated robot arm, the arm 71 is not limited thereto.

The arm 71 includes a lifting/lowering shaft 70 supported by the base 73 and at least one of links 75 and 76. In the arm 71 according to the present embodiment, a base end of the first link 75 is coupled to an upper end of the lifting/lowering shaft 70 via a first joint J1, and a base end of the second link 76 is coupled to a distal end of the first link 75 via a second joint J2. A base end of the hand 72 is coupled to a distal end of the second link 76 via a first wrist joint J3 and a second wrist joint J4. The first joint J1, the second joint J2, and the first wrist joint J3 are joints which connect two elements such that the two elements are rotatable around a vertical axis. The second wrist joint J4 is a joint which connects two elements such that the two elements are rotatable around a horizontal axis.

The hand 72 includes a hand base portion 51 coupled to a distal end of the arm 71 and a blade 52 coupled to the hand base portion 51. The blade 52 is provided with a holding device (not shown) for holding the substrate 6. This holding device may prevent the substrate 6 placed on the blade 52 from being disengaged from the blade 52 by fitting, attraction, holding, or other methods.

The base 73 includes a lifting/lowering drive device 60 which drives the lifting/lowering shaft 70 to lift/lower it. The lifting/lowering drive device 60 includes, for example, a servo motor which angularly displaces according to a signal given from the controller 8, a power transmission mechanism which includes a speed reduction device and converts the power of the servo motor into a straightforward force to transmit the force to the lifting/lowering shaft 70, and a position detector which detects an angular displacement of the servo motor (none of which are shown). The first link 75 includes a first joint drive device 61 which drives the first joint J1 and a second joint drive device 62 which drives the second joint J2. The second link 76 includes a first wrist joint drive device 63 which drives the first wrist joint J3. The hand base portion 51 includes a second wrist joint drive device 64 which drives the second wrist joint J4. The drive devices 61 to 64 of the respective joints J1 to J4 include a servo motor which angularly displaces according to a signal given from the controller 8, a power transmission mechanism which includes a speed reduction device and transmits the power of the servo motor to a link body, and a position detector which detects an angular displacement of the servo motor (none of which are shown).

The imaging device 9 includes a camera 91 and an irradiation device 92 which irradiates light to an imaging range of the camera 91. In the present embodiment, although the imaging device 9 is attached to the hand base portion 51, the imaging device 9 may be attached to the arm 71. The camera 91 is moved integrally with the hand 72 by the arm 71.

The controller 8 governs the operation of the substrate transfer robot 7. The controller 8 includes a robot control section 81 and a carrier position adjustment section 82. The controller 8 is a so-called computer and has, for example, a processor 8a such as a microcontroller, CPU, MPU, PLC, DSP, ASIC or FPGA and a memory 8b such as ROM and RAM. The memory 8b stores a program to be executed by the processor 8a including a carrier position adjustment program. The memory 8b also stores data and the like used for processing to be performed by the processor 8a. In the controller 8, the processor 8a reads out and executes the program stored in the memory 8b, so that processing for functioning as the robot control section 81 and the carrier position adjustment section 82 is performed. It should be noted that the controller 8 may be configured as a single computer performing each processing by centralized control, or may be configured as a plurality of computers performing distributed control in cooperation with each other, thereby performing each processing.

The robot control section 81 of the controller 8 controls the operation of the substrate transfer robot 7. More specifically, the robot control section 81 is electrically connected to the lifting/lowering drive device 60, the first joint drive device 61, the second joint drive device 62, the first wrist joint drive device 63, and the second wrist joint drive device 64. The robot control section 81 acquires rotation positions of the servo motors from the position detectors included in these drive devices and calculates a target pose based on a pose (position and orientation) of the hand 72 corresponding to the rotation positions and stored teaching point data. In addition, the robot control section 81 outputs a control command to a servo amplifier, such that the hand 72 is placed in the target pose. The servo amplifier supplies driving electric power to each servo motor based on the control command, whereby the hand 72 is moved and placed in the target pose.

The carrier position adjustment section 82 of the controller 8 detects a positional displacement of the carrier 16 coupled to the load port 2 and makes it reflect the operation of the substrate transfer robot 7. Hereinafter, carrier position adjustment processing performed by the substrate transfer robot 7 will be described.

The carrier position adjustment processing is performed in a state where the carrier 16 is coupled to the load port 2 and the carrier 16 and the transfer chamber 30 are communicated with each other through the port opening 22. However, the presence or absence of the substrate 6 in the carrier 16 is irrelevant.

First, the controller 8 operates the arm 71 to move the camera 91 such that the carrier 16 coupled to a peripheral edge of the port opening 22 and the port opening 22 enters a capture range.

Then, the controller 8 causes the camera 91 to capture the peripheral edge of the port opening 22 and the carrier 16 coupled to the port opening 22 and acquires the captured image. The camera 91 captures the port opening 22 and the carrier 16 from a first side (outside of the substrate transfer apparatus 3) to which the carrier 16 of the load port 2 is coupled and a second side (inside of the substrate transfer apparatus 3) opposite to the first side via the load port 2.

Subsequently, the controller 8 performs image processing on the acquired captured image, thereby obtaining a deviation of an actual coupling position of the carrier 16 from a predetermined reference coupling position defined in the load port 2. The reference coupling position is referred to the position of the carrier 16 when the carrier 16 is coupled to the port opening 22 without inclination or displacement.

Figure 4:
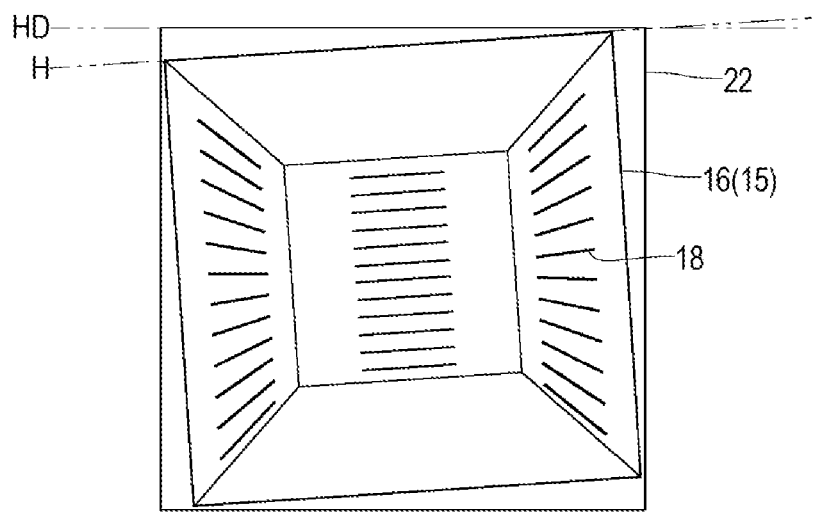
FIG. 4 is a view showing Example 1 of a captured image.

Specifically, the controller 8 extracts profiles of the peripheral edge of the port opening 22, an inner wall of the carrier 16 appearing inside the port opening 22, and the shelf plate 18 (or the substrate 6) in the captured image. For example, as shown in FIG. 4, the controller 8 can specify a horizontal reference line HD of the port opening 22 in the captured image from profiles of upper and lower edges of the port opening 22 in the captured image. The controller 8 can also specify a horizontal line H of the carrier 16 in the captured image from the profiles of the inner wall of the carrier 16 and the shelf plate 18 (or the substrate 6). When the carrier 16 coupled to the load port 2 is located at the reference coupling position, the reference horizontal line and the horizontal line are parallel to each other. The controller 8 detects an inclination of the horizontal line of the carrier 16 from the reference horizontal line of the port opening 22 in the captured image and takes the inclination as the deviation of the coupling position (inclination deviation).

Figure 5:
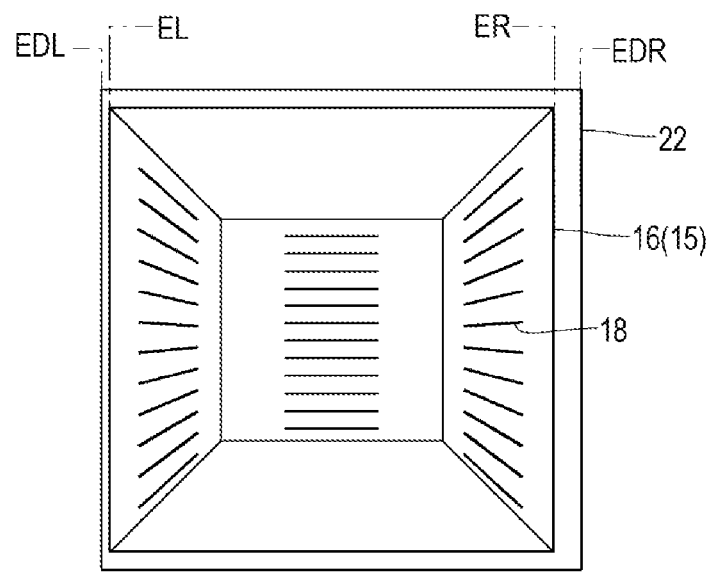
FIG. 5 is a view showing Example 2 of the captured image.

For example, as shown in FIG. 5, the controller 8 can specify a left edge EDL and a right edge EDR of the port opening 22 in the captured image from profiles of both horizontal ends of the port opening 22. The controller 8 can also specify a left edge EL and a right edge ER of the carrier 16 in the captured image from the profiles of the inner wall of the carrier 16 and the shelf plate 18 (or the substrate 6). The controller 8 determines at least one of a distance (left edge opening) of the left edge EL of the carrier 16 from the left edge EDL of the port opening 22 in the captured image and a distance (right edge opening) of the right edge ER of the carrier 16 from the right edge EDR of the port opening 22 in the captured image, and the distance is taken as the deviation of the coupling position (deviation of the lateral position). When the carrier 16 coupled to the load port 2 is located at the reference coupling position, the deviation of the lateral position is a previously stored predetermined value.

The controller 8 previously stores, as a reference image, an image obtained when the carrier 16 coupled to the load port 2 is located at the reference coupling position, and compares the reference image with the captured image, whereby the deviation of the coupling position of the carrier 16 from the reference coupling position (the inclination deviation and the deviation of the lateral position) may be detected.

As described above, the controller 8 detects at least one of the inclination deviation and the deviation of the lateral position, and when the deviation is larger than a previously stored threshold value, the controller 8 adjusts the operation of the arm 71 while taking the deviation into account when the substrate 6 is delivered/received to/from the carrier 16. More specifically, the carrier position adjustment section 82 outputs the deviation as adjustment information to the robot control section 81 or stores the deviation as the adjustment information, and the robot control section 81 adds the adjustment information to control the operation of the arm 71. As a result, a target position of the hand 72 is moved vertically or horizontally with respect to a stored (taught) target position, or a main surface of the blade 52 is inclined. By thus adjusting the operation of the arm 71, when the substrate 6 is delivered/received to/from the carrier 16 with the hand 72, the hand 72 allows the target substrate 6 to more accurately access the shelf plate 18, and it is possible to avoid a situation where the hand 72 and the substrate 6 interfere with each other.

In the substrate transfer robot 7 according to the present embodiment, since the arm 71 has the second wrist joint J4 (rotation shaft) in addition to the first wrist joint J3 (pivot), the inclination deviation of the carrier 16 can be adjusted by inclining the main surface of the blade 52 from the horizontal. When a wrist shaft of the arm 71 has no rotation shaft, it is difficult to tilt the main surface of the blade 52. Therefore, when the inclination deviation is larger than the previously stored threshold value, the controller 8 may be configured to notify that the carrier 16 is recoupled to the load port 2.

As described above, the substrate transfer robot 7 of the present embodiment delivers/receives the substrate 6 to/from the carrier 16 of the substrate 6, coupled to the opening 22 of the load port 2 on the first side of the load port 2, from the second side opposite to the first side via the load port 2 through the opening 22, and the substrate transfer robot 7 includes the hand 22 holding the substrate 6, the robot arm 71 coupled to the hand 22 and displacing the hand 72, the imaging device 9 attached to the hand 72 or the robot arm 71, and the controller 8 controlling the operation of the robot arm 71 and the imaging device 9. The controller 8 acquires a captured image including the peripheral edge of the opening 22 captured from the second side by the imaging device 9 and the carrier 16 coupled to the opening 22 and performs image processing on the captured image, whereby the deviation of the coupling position of the carrier 16 from a predetermined reference coupling position is detected.

According to the substrate transfer robot 7, the displacement of the coupling position of the carrier 16 with respect to the load port 2 can be detected based on an image captured by the imaging device 9 mounted on the robot itself. This detection result can be reflected on the operation of delivering/receiving the substrate 6 to/from the carrier 16 of the substrate transfer robot 7. With one substrate transfer robot 7, the displacement of the coupling position of the carrier 16 with respect to a plurality of the load ports 2 can be similarly detected. In addition, regardless of the specifications of the load port 2 and the carrier 16, the displacement of the coupling position of the carrier 16 with respect to the load port 2 can be similarly detected.

In the substrate transfer robot 7, as shown in the present embodiment, the controller 8 may be configured such that the operation of the robot arm 71 is adjusted taking the deviation into account when the robot arm 71 delivers/receives the substrate to/from the carrier 16.

Thus, since the robot arm 71 operates taking the detected deviation into account, the hand 72 can more accurately access the target substrate 6. Thus, the operation of delivering/receiving the substrate 6 by the hand 72 is stabilized, and it is possible to avoid a situation where the hand 72 interferes with the substrate 6.

Further, in the substrate transfer robot 7, as shown in the present embodiment, the deviation may include the inclination of the horizontal line of the carrier 16 from the reference horizontal line defined in the opening 22.

As a result, the controller 8 can know whether or not the carrier 16 coupled to the load port 2 tilts from the reference coupling position.

Furthermore, in the substrate transfer robot 7, as shown in the present embodiment, the deviation may include a distance from a horizontal end of the opening 22 to a horizontal end of the carrier 16.

As a result, the controller 8 can know whether or not the position of the carrier 16 coupled to the load port 2 deviates horizontally (laterally) from the reference coupling position.

Although the preferred embodiment of the present invention has been described, specific structural and/or functional details of the above embodiment may be altered without departing from the spirit of the present invention.

DESCRIPTION OF REFERENCE CHARACTERS

2: load port
3: substrate transfer apparatus
4: substrate processing apparatus
5: fan filter unit
6: substrate
7: substrate transfer robot
8: robot controller
8a: processor
8b: memory
9: imaging device
15: container
16: carrier
17: lid
18: shelf plate
19: flange
21: stage
22: hand
23: plate
24: door
27: flange panel
28: door drive device
29: stage drive device
30: transfer chamber
31: housing
41: load lock chamber
42: transfer chamber
43: process chamber
51: hand base portion
52: blade
60-65: drive device
70: lifting/lowering shaft
71: robot arm
72: hand
73: base
75,76: link
81: robot control section
82: carrier position adjustment section
91: camera
92: irradiation device
100: substrate processing equipment

What is claimed is:

1. A substrate transfer robot configured to deliver/receive a substrate to/from a carrier for the substrate, coupled to an opening of a load port on a first side of the load port, from a second side opposite to the first side via the load port through the opening, the substrate transfer robot comprising:
- a hand holding the substrate;
- a robot arm coupled to the hand and displacing the hand;
- an imaging device attached to the hand or the robot arm; and
- a controller configured to control operation of the robot arm and the imaging device,
- wherein the controller acquires a captured image including a peripheral edge of the opening and the carrier coupled to the opening and performs image processing on the captured image to detect a deviation of a coupling position of the carrier from a predetermined reference coupling position, the peripheral edge and the carrier being captured from the second side by the imaging device.

2. The substrate transfer robot according to claim 1, wherein the controller adjusts the operation of the robot arm by taking the deviation into account when the robot arm delivers/receives the substrate to/from the carrier.

3. The substrate transfer robot according to claim 1, wherein the deviation includes an inclination of a horizontal line of the carrier from a reference horizontal line defined in the opening.

4. The substrate transfer robot according to claim 1, wherein the deviation includes a distance from a horizontal end of the opening to a horizontal end of the carrier.

5. The substrate transfer robot according claim 2, wherein the deviation includes an inclination of a horizontal line of the carrier from a reference horizontal line defined in the opening.

6. The substrate transfer robot according to claim 2, wherein the deviation includes a distance from a horizontal end of the opening to a horizontal end of the carrier.

7. The substrate transfer robot according to claim 3, wherein the deviation includes a distance from a horizontal end of the opening to a horizontal end of the carrier.

8. The substrate transfer robot according to claim 5, wherein the deviation includes a distance from a horizontal end of the opening to a horizontal end of the carrier.

* * * * *